United States Patent [19]
Wu

[11] Patent Number: 6,084,265
[45] Date of Patent: *Jul. 4, 2000

[54] HIGH DENSITY SHALLOW TRENCH CONTACTLESS NONVOLITILE MEMORY

[75] Inventor: Shye-Lin Wu, Hsinchu, Taiwan

[73] Assignee: Texas Instruments - Acer Incorporated, Hsinchu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 09/050,540

[22] Filed: Mar. 30, 1998

[51] Int. Cl.$^7$ ...................................................... H01L 29/76
[52] U.S. Cl. ...................... 257/332; 257/314; 257/321; 257/330; 257/334; 438/259
[58] Field of Search ................................ 257/314, 316, 257/317, 321, 330, 332, 334; 365/185.01, 185.05, 185.06, 185.1, 185.26; 438/201, 211, 259

[56] References Cited

U.S. PATENT DOCUMENTS

| | | | |
|---|---|---|---|
| Re. 35,810 | 5/1998 | Prall | 438/257 |
| 5,258,645 | 11/1993 | Sato | 257/637 |
| 5,488,244 | 1/1996 | Quek et al. | 257/314 |
| 5,545,907 | 8/1996 | Maari | 257/315 |
| 5,554,866 | 9/1996 | Nishioka et al. | 257/295 |
| 5,570,314 | 10/1996 | Gill | 365/185.1 |
| 5,637,896 | 6/1997 | Huang | 257/316 |
| 5,744,847 | 4/1998 | Wen | 257/397 |
| 5,773,343 | 6/1998 | Lee et al. | 438/259 |

OTHER PUBLICATIONS

Albert Bergemont et al., *Low Voltage NVG™: A New High Perfromance 3V/5 V Flash Technology for Portable Computing and Telecommunications Applications*, IEEE Transactions on Electron Devices, vol. 43, No. 9, Sep. 1996, pp. 1510–1517.

H. Shirai et al., *A 0.54μm$^2$ Self–Aligned, HSG Floating Gate Cell (SAHF Cell) for 256Mbit Flash Memories*, 1995 IEEE, pp. 653–656.

Paul–Henri Bricout et al., *Short–Channel Effect Immunity and Current Capabiity of Sub–0.1–Micron MOSFET's Using a Recessed Channel*, IEEE Transactions on Electron Devices, vol. 43, No. 8, Aug. 1996, pp. 1251–1255.

*Primary Examiner*—Mahshid Saadat
*Assistant Examiner*—George C. Eckert, II
*Attorney, Agent, or Firm*—Harness, Dickey & Pierce, P.L.C.

[57] ABSTRACT

The present invention proposes a novel structure of nonvolatile memories with recessed floating gates. A plurality of field oxides is formed on a semiconductor substrate. Buried bit lines are formed in the semiconductor substrate and beneath the field oxides. Between the field oxides over the buried bit lines, trenched floating gates are formed in the semiconductor substrate. Tunnel dielectrics are formed between the trenched floating gates and the semiconductor substrate. The interpoly dielectric is formed over the field oxides and the trenched floating gates and the control gates are formed on the interpoly dielectric. Because of the large area of the recessed tunnel dielectric and the recessed length of the channel, high-density shallow trench contactless nonvolatile memories can be achieved.

10 Claims, 4 Drawing Sheets

HIGH DENSITY SHALLOW TRENCH CONTACTLESS NONVOLITILE MEMORY

BACKGROUND OF THE INVENTION

1. Field of the Invention

The present invention relates to nonvolatile memories, and more especially, to high density shallow trench contactless nonvolatile memories.

2. Description of the Prior Art

Nonvolatile memories, including mask read-only memories (Mask ROM), programmable ROM (PROM), erasable programmable ROM (EPROM), electrically erasable programmable ROM (EEPROM or $E^2$PROM) and flash memories, retain their memory data whenever the power is turned off, and have wide applications in the computer and electronic industry. In recent years, the portable computers and telecommunications market has developed rapidly and have become a major driving force in the design and technology of the semiconductor integrated circuit. As stated by A. Bergemont, et al., in "Low Voltage NVG™: A New High Performance 3 V/5 V Flash Technology for Portable Computing and Telecommunications Application" (IEEE Trans. Electron Devices Vol. 43, p. 1510, 1996), it creates a great need for low power, high density, and electrically re-writable nonvolatile memories. That is, the memories programmable and erasable as EPROM, $E^2$PROM or flash memories are required for aforementioned systems to store operating systems or applications software.

The basic storage cell of these programmable and erasable memories contain a double polysilicon storage transistor with a floating gate isolated in silicon dioxide and capacitively coupled to a second control gate which is stacked above it. The $E^2$PROM cell further comprises an access, or select, transistor. These memories execute the program and erasure by charging or discharging their floating gates. For example, the EPROM is programmed by hot electron injection at the drain to selectively charge the floating gate and erased by discharging the floating gate with ultraviolet light or X-ray, which the latter has never been commercially applied for this purpose. The $E^2$PROM and most of the flash memories are programmed by hot electron injection or cold electron tunneling named Flower-Nordheim tunneling, and erased mostly by Flower-Nordheim tunneling from the floating gate to the source, with the control gate ground. Herein the Flower-Nordheim tunneling, or cold electron tunneling, is a quantum-mechanical effect, which allows the electrons to pass through the energy barrier at the silicon-silicon dioxide interface at a lower energy than required to pass over it.

H. Shirai, et al., developed a method for fabricating 256 Mbit Flash memories with self-aligned, hemispherical grained polysilicon floating gate in their paper "A 0.541 $\mu m^2$ Self-Aligned, HSG Floating Gate Cell (SAHF Cell) for 256 Mbit Flash Memories" (IEDM Tech. Dig. Vol. 95, p. 653, 1995). In this work, the hemispherical grained (HSG) polysilicon is applied to floating gate to extend the upper surface area double that of the floating gate in comparison with the conventional one. And, a high capacitive-coupling ratio of 0.8 and buried N+ diffusion layers which are self-aligned to the floating gate, are realized. With contactless array and Flower-Nordheim program/erase scheme, a cell structure for achieving a high density and low power flash memory is proposed.

On the other hand, it will be needed to decrease the device dimensions in a wafer for achieving the demand of high density, and it is accompanied with the problem of the short channel effect. The short channel effect may affect the electrical performance due to the reduction and degradation of the threshold voltage, that in turn increase the subthreshold current level and power dissipation. P. H. Bricout, et al., suggest in their article titled "Short-Channel Effect Immunity and Current Capability of Sub-0.1-Micron MOSFET's Using a Recessed Channel" in IEEE Trans. Electron Devices, Vol. 43, p. 1251, 1996, that the recessed channel structure nearly keeps the same threshold voltage for all channel length. This behavior is attribute to a "coupling" of the potential barrier created at both corners at the recessed floating gate. Due to this corner effect, the short channel effect can be suppressed by the appropriate geometry of the interface of the recessed channel. In addition, for equal noise margin, it is possible to use a lower concentration than in planar devices, and thus the degradation of the current device capability is limited.

SUMMARY OF THE INVENTION

A method for fabricating a high-density shallow trench contactless nonvolatile memory is disclosed. This method utilizes recessed floating gate structure to suppress the short channel effect. First, a stacked pad oxide/silicon nitride layer is deposited on the semiconductor substrate and the buried bit line region is defined by a photoresist using a standard photolithography process. An anisotropic etching follows to etch the silicon layer and then the n+ impurity ions are implanted to form the source and drain using the patterned photoresist as a mask. After stripping the photoresist, a high temperature steam oxidation process is used to grow a thick field oxide using the silicon nitride layer as a mask, and the doped ions are activated and driven in to form the buried bit lines simultaneously. The masking silicon nitride layer and the pad oxide layer are then removed, and the silicon substrate is recessed by using the field oxide as an etching mask. After rounding the trench corners by using thermal oxidation and etching back processes, a thin silicon oxynitride film is regrown over the substrate. An insitu doped polysilicon film is deposited to refill the trench region and then etch back by using a CMP process to form the floating gates adjacent to the buried bit lines. Next, the interpoly dielectric such as ultra-thin ONO film, and, the control gate formed of n+ doped polysilicon film, are sequentially built. After the word lines are defined, the present nonvolatile memory is finished.

The present invention thus proposes a novel structure of nonvolatile memories with recessed floating gates described as follows. A plurality of field oxides is formed on a semiconductor substrate. Buried bit lines are formed in the semiconductor substrate and beneath the field oxides. Between the field oxides over the buried bit lines, trenched floating gates are formed in the semiconductor substrate. Tunnel dielectrics are formed between the trenched floating gates and the semiconductor substrate. The interpoly dielectric is formed over the field oxides and the trenched floating gates and the control gates are formed on the interpoly dielectric. Because of the large area of the recessed tunnel dielectric and the recessed length of the channel, the high-density shallow trench contactless nonvolatile memories can be achieved.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention proposes a method to fabricate high-density shallow trench contactless nonvolatile memory. The method described here includes many process steps well known in the art like photolithography, etching or chemical vapor deposition (CVD) which are not discussed in detail. In addition, the present invention utilizes the recessed floating gate structure to suppress the short channel effect.

Figure 1:
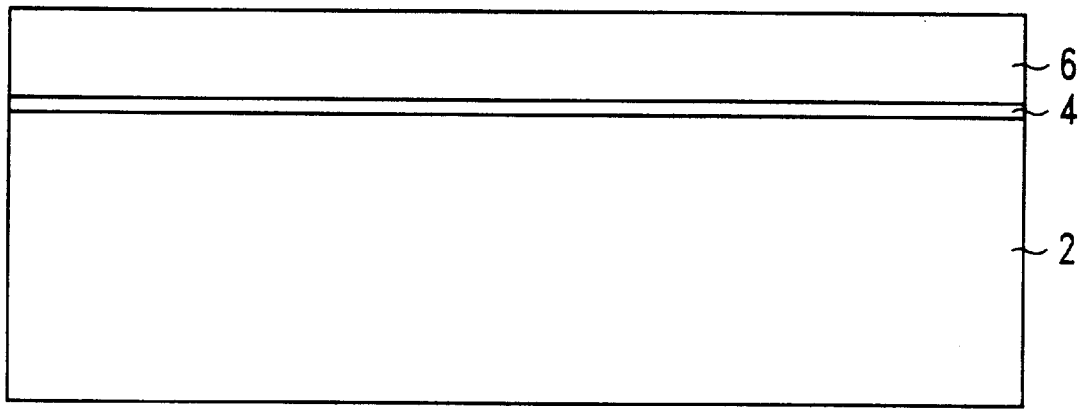
FIG. 1 is a cross-sectional view of a semiconductor wafer illustrating the step of forming a silicon oxide layer and a silicon nitride layer on the substrate according to the present invention.

Referring to FIG. 1, a single crystal silicon substrate 2 with a <100> crystallographic orientation is provided. A silicon oxide layer 4 is formed on the surface of the substrate 2 to serve as a pad oxide for the oxidation mask and as a sacrificial oxide for later ion implantation. The thickness of this pad oxide layer 4 is about 50–350 angstroms. The suitable method to formed the pad oxide layer 4 can be a thermal oxidation at a temperature of about 800–1100°C., or a low pressure chemical vapor deposition (LPCVD) at a temperature of about 400–800° C. Next, a thick silicon nitride layer 6 is deposited, for example, using a LPCVD process at a temperature of about 700–800° C., on the pad oxide layer 4. The silicon nitride layer 6 has a thickness of about 500–2500 angstroms, and serves as an oxidation mask while the field oxide is grown.

Figure 2:
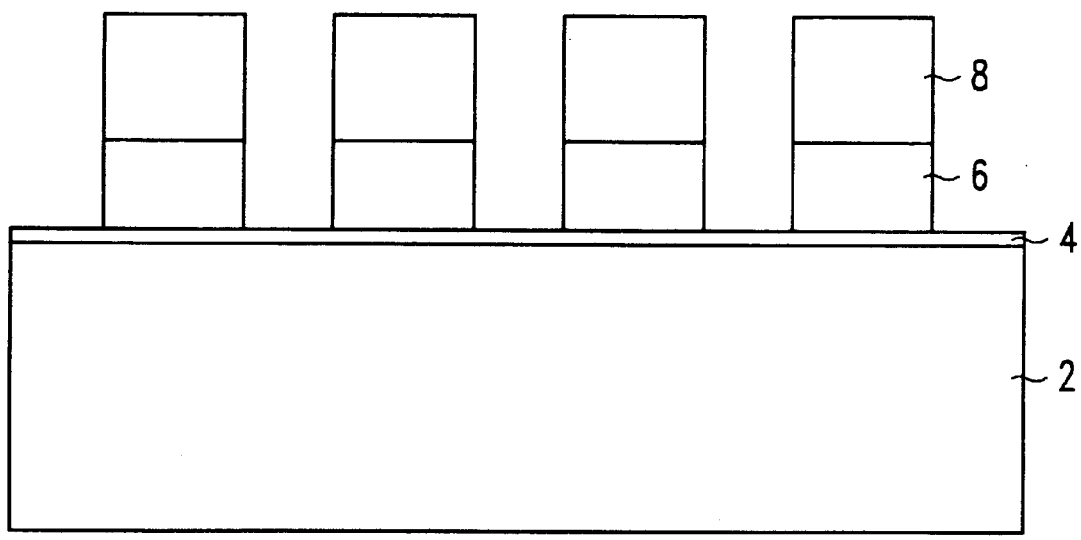
FIG. 2 is a cross-sectional view of a semiconductor wafer illustrating the step of defining the buried bit line regions on the substrate by patterning a photoresist and etching the silicon nitride layer according to the present invention.
Figure 3:
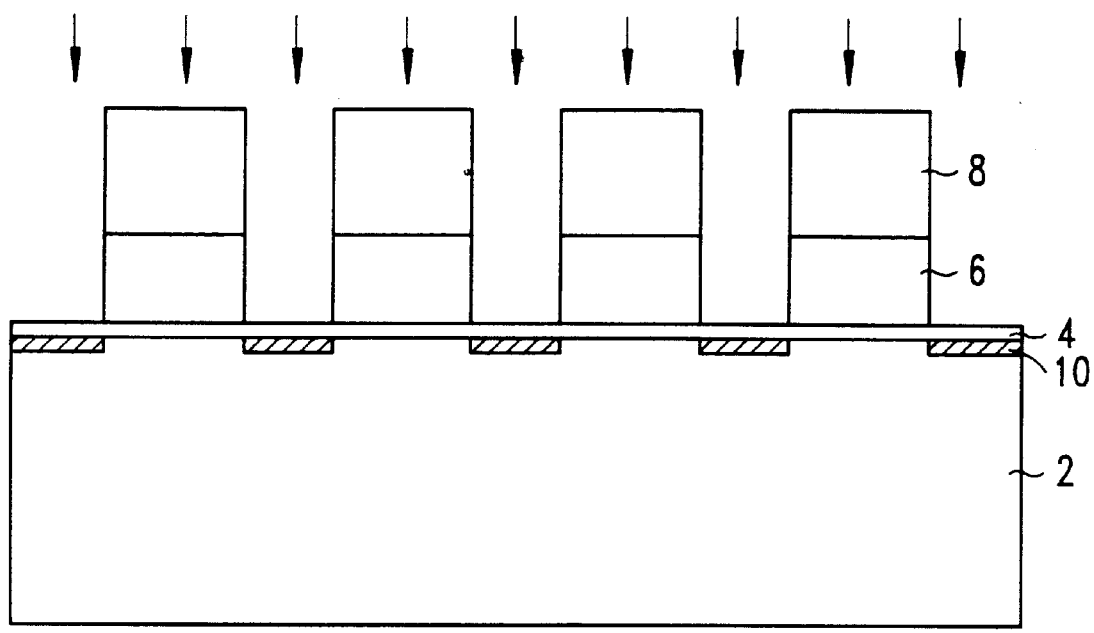
FIG. 3 is a cross-sectional view of a semiconductor wafer illustrating the step of performing a source/drain implantation according to the present invention.

Turning next to FIG. 2, a photoresist 8 with the pattern of buried bit lines is formed over the silicon nitride layer 6. This buried bit line pattern is defined by using a standard manner of photolithography including photoresist coating, exposure and development processes. An etching step follows to selectively etch the silicon nitride layer 6 and expose a portion of the pad oxide layer 4 which defines the buried bit line region on the substrate 2. Thereafter, an N+ source/drain implantation indicated by the arrows shown in FIG. 3 is performed to dope the appropriate impurity ions into the buried bit line region of the substrate 2 uncovered by the photoresist 8. The implanted ions can be phosphorus ions, arsenic ions or antimony ions. The doping energy used by this ion implantation is about 0.5–150 keV and the dosage is about $5 \times 10^{14}$–$5 \times 10^{16}$ atoms/cm$^2$.

Figure 4:
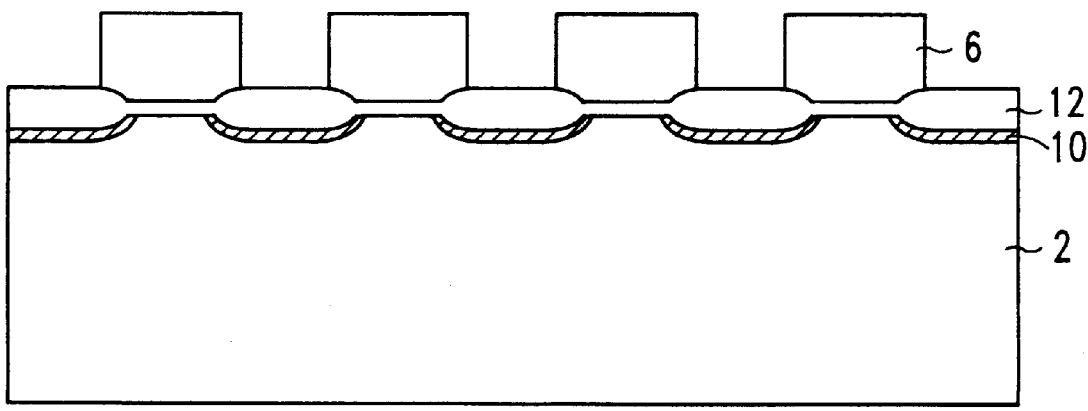
FIG. 4 is a cross-sectional view of a semiconductor wafer illustrating the step of growing a thick thermal oxide on the substrate according to the present invention.

Turning next to FIG. 4, after photoresist 8 is removed and wet cleaned, a high temperature steam oxidation is performed at about 800–1100° C. At this step, the thick field oxide regions 12 are grown with a thickness of about 500–5000 angstroms, and the dopants are activated and driven in to form the buried bit lines 10 simultaneously. In addition to the isolation between the floating gates, this thick field oxide layer 12 can be used as an etching mask while the shallow trenches are formed.

Figure 5:
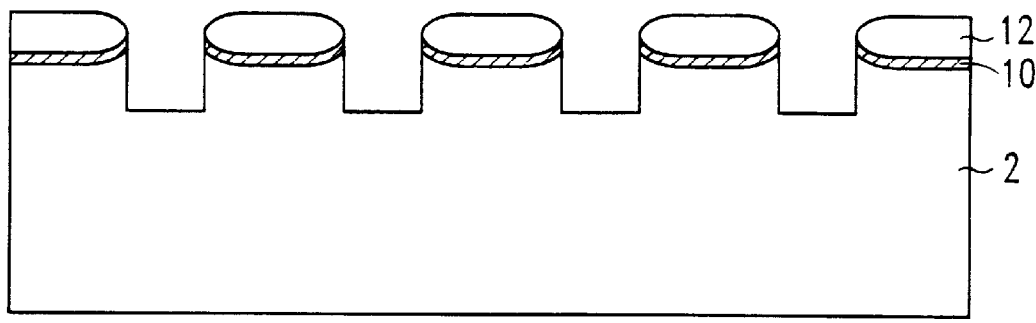
FIG. 5 is a cross-sectional view of a semiconductor wafer illustrating the step of recessing the silicon substrate to form shallow trench according to the present invention.

Next, as shown in FIG. 5, the residual silicon nitride layer 6 and the pad oxide layer 4 are removed to expose a portion of the substrate 2 using a suitable etching method. For example, the method using hot solution of phosphoric acid (H$_3$PO$_4$) as the etchant to etch the silicon nitride layer 6 and using diluted solution of hydrofluoric acid (HF) as the etchant to etch the pad oxide layer 4 is preferable. Thereafter, using the thick oxide layer 12 over the buried bit line as a hard mask, the substrate 2 is recessed to form shallow trenches by dry etching process. The etching gases containing both chlorine and fluorine have come to be preferred for this etching. Because the chlorine plasma source such as Cl$_2$, BCl$_3$, or SiCl$_4$ gas exhibits excellent selectivity to silicon over silicon oxide and the fluorine plasma source such as SF$_6$, a high etching rate is maintained.

Figure 6:
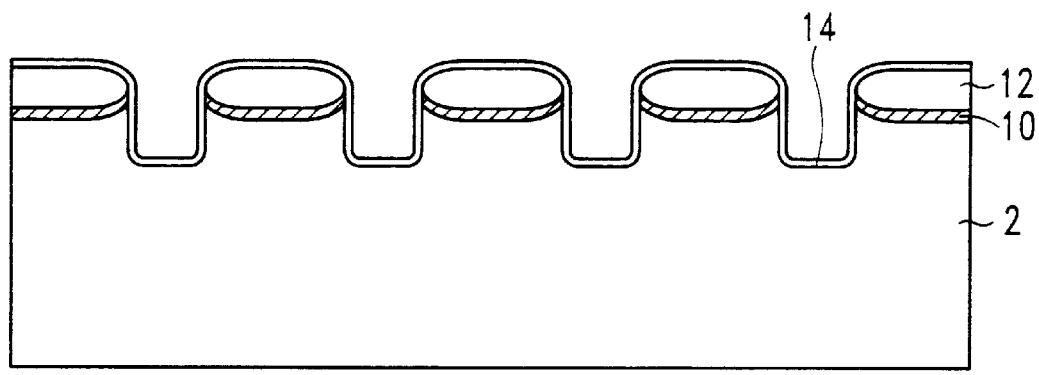
FIG. 6 is a cross-sectional view of a semiconductor wafer illustrating the step of rounding the trench corner and then growing a thin silicon oxynitride layer on the substrate according to the present invention.

Referring to FIG. 6, the trench corners are rounded by a thermal oxidation followed by an etching back process. The thermal oxidation is performed at a temperature of about 750–1150° C. in a dry or wet oxygen ambience. The suitable etchant of this wet etching can be buffered oxide-etching (BOE) solution or diluted solution of hydrofluoric acid (HF). Next, a thin silicon oxynitride layer 14 with the thickness of about 30–250 angstroms is regrown over the substrate 2 to provide the tunnel dielectric on the surface of the shallow trenches. This thin silicon oxynitride layer 14 can be formed by N$_2$O or NO oxidation process. Alternatively, it can also be formed by depositing an ultra-thin silicon nitride film followed by a reoxidation process.

Figure 7:
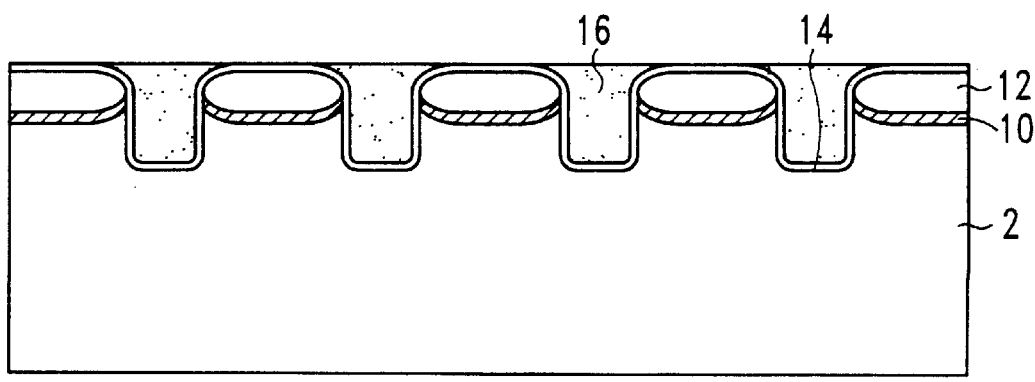
FIG. 7 is a cross-sectional view of a semiconductor wafer illustrating the step of depositing an n+ polysilicon into the shallow trench and etching back according to the present invention.

Next, referring to FIG. 7, the recessed floating gates 16 are formed of in-situ doped polysilicon by next two steps. First, the material of in-situ doped polysilicon is deposited on the semiconductor substrate 2 to refill the trench region by using a conventional in-situ doped LPCVD at a temperature of about 400–620° C. Then, a portion of the in-situ doped polysilicon, which exceeds the trenches, is removed. A chemical mechanical polish (CMP) is proper for this process to strip the exceeding polysilicon because it can provide global planarization for the semiconductor substrate 2 at the same time. The portion of the silicon oxynitride layer 14 on the field oxide 12 serves as the stopping layer at the CMP process. Thus, the recessed floating gate region 16 adjacent to the buried bit lines is formed with the silicon oxynitride layer 14 as the tunnel dielectric.

Figure 8:
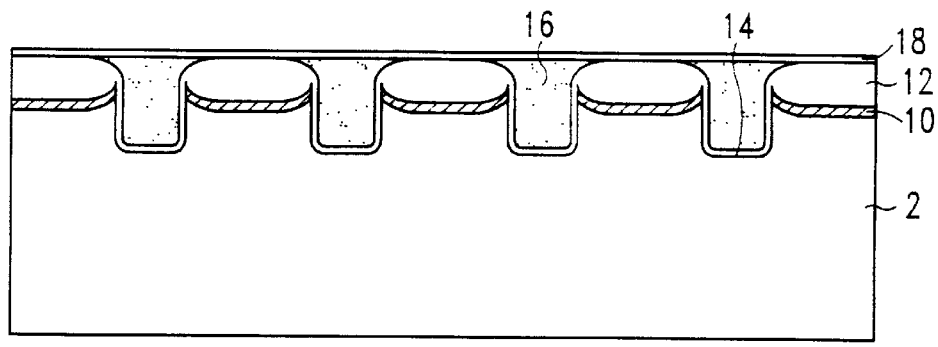
FIG. 8 is a cross-sectional view of a semiconductor wafer illustrating the step of forming an ultra-thin ONO film on n+ poly-Si film according to the present invention.

The ultra-thin interpoly dielectric (IPD) layer 18 deposited on the surface of the substrate 2 is now shown in FIG. 8. In general, this interpoly dielectric layer 18 can be a material of a double film of silicon nitride and silicon oxide, a triple film of silicon oxide, silicon nitride and silicon oxide (ONO), or any other high dielectric constant film such as tantalum pentoxide ($Ta_2O_5$) or BST.

Figure 9:
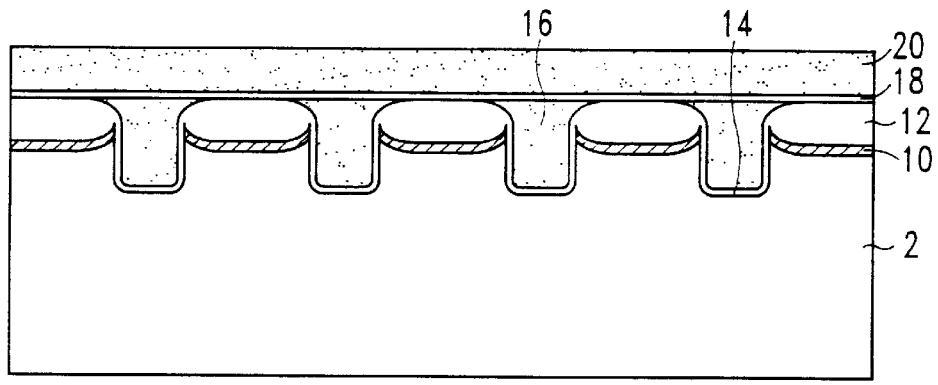
FIG. 9 is a cross-sectional view of a semiconductor wafer illustrating the step of depositing an n+ polysilicon film and then defining the word line according to the present invention.

Finally, referring to FIG. 9, another conductive layer 20 formed of doped or in-situ doped n+ polysilicon is deposited on the interpoly dielectric layer 18 to serve as the control gates. After patterning the conductor layer 20 to define the word lines, the high-density shallow trench contactless nonvolatile memory is finished according to the present invention.

Figure 10:
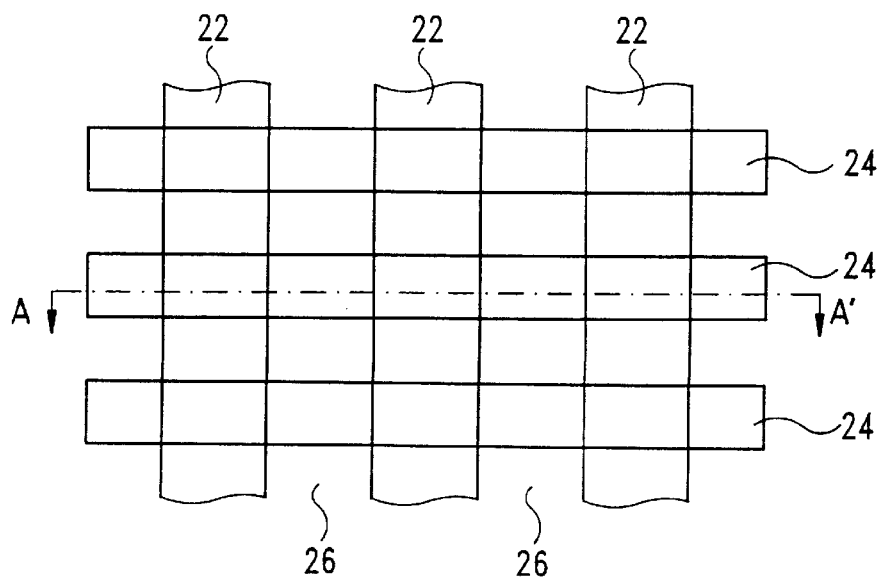
FIG. 10 is a top view of the high-density shallow trench contactless nonvolatile memory of the present invention.

FIG. 10 shows the top view of the high-density shallow trench contactless nonvolatile memory of the present invention. Regions 22 represent the trenched floating gates. Regions 24 are the word lines, and the regions 26, which are adjacent to the trenched floating gates 22, represent the buried bit line pattern. The AA' cross section is illustrated in FIG. 1 to FIG. 9 for the manufacturing formulation of the present nonvolatile memories.

The present invention proposes a novel structure of nonvolatile memories with recessed floating gates that are shown in FIG. 9. This nonvolatile memory structure is described as follows. A plurality of field oxides 12 is formed on the semiconductor substrate 2. Buried bit lines 10 are formed in the semiconductor substrate 2 and beneath the field oxides 12. Between the field oxides 12 over the buried bit lines 10, trenched floating gates 16 are formed in the semiconductor substrate 2. Tunnel dielectrics 14 are formed between the trenched floating gates 16 and the semiconductor substrate 2. These tunnel dielectrics 14 have recessed geometry conformable with the sidewall and bottom surfaces of those trenched floating gates 16. The interpoly dielectric 18 is formed over the field oxides 12 and the trenched floating gates 16. The control gates 20 are formed on the interpoly dielectric 18.

This recessed floating gate structure proposed above results in recessed tunnel dielectrics and recessed channels. Because of the larger area of the recessed tunnel dielectric than that of traditional structure, the programming and erasing speed of present invention will be much faster than that of traditional one. Also the recessed channel length is much longer than that of planar structure, then the short channel effect will be suppressed, and the device integration can be increased. Furthermore, because the floating gates is set under the wafer surface, the stacked control gates is easy to be planarized, and the periphery devices can be etched by the same mask using in the floating gate patterning.

As is understood by a person skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. Nonvolatile memories with trenched gates formed on a semiconductor substrate, said memories comprising:
   field oxides formed on said semiconductor substrate;
   buried bit lines formed beneath said field oxides in said semiconductor substrate;
   trenched floating gates formed in said semiconductor substrate, said trenched floating gates are located between said field oxides over said buried bit lines;
   tunnel dielectrics formed between said trenched floating gates and said semiconductor substrate, said tunnel dielectrics being formed with both ends respectively adjacent to one of said buried bit lines, and having recessed geometry conformable with the sidewall and bottom surfaces of said trenched floating gates;
   an interpoly dielectric formed on said field oxides and said trenched floating gates; and
   control gates formed on said interpoly dielectric.

2. The memories of claim 1, wherein said semiconductor substrate is a p-type substrate.

3. The memories of claim 1, wherein said field oxides are formed of silicon oxide with a thickness of about 500 angstroms to about 5000 angstroms.

4. The memories of claim 1, wherein said buried bit lines are n-type ion doped regions.

5. The memories of claim 4, wherein said n-type ions are selected from the group consisting of phosphorus ions, arsenic ions and antimony ions.

6. The memories of claim 1, wherein said trenched floating gate is formed of in-situ n-type doped polysilicon.

7. The memories of claim 1, wherein said trenched floating gates have rounded corners.

8. The memories of claim 1, wherein said tunnel oxides are formed of silicon oxynitride with a thickness of about 30 angstroms to about 250 angstroms.

9. The memories of claim 1, wherein said interpoly dielectric is formed of a material selected from the group consisting of tantalum pentoxide ($Ta_2O_5$), barium strontium titanate (BST), a double film of silicon nitride and silicon oxide, and a triple film of silicon oxide, silicon nitride and silicon oxide (ONO).

10. The memories of claim 1, wherein said control gate is formed of a material selected from the group consisting of n-type doped polysilicon and in-situ n-type doped polysilicon.

* * * * *